United States Patent [19]

Hollman

[11] Patent Number: 5,359,388
[45] Date of Patent: Oct. 25, 1994

[54] MICROLITHOGRAPHIC PROJECTION SYSTEM

[75] Inventor: Richard F. Hollman, Chelmsford, Mass.

[73] Assignee: General Signal Corporation, Stamford, Conn.

[21] Appl. No.: 42,150

[22] Filed: Apr. 2, 1993

[51] Int. Cl.⁵ .............................. G03B 27/42
[52] U.S. Cl. ............................ 355/53; 355/67; 355/71
[58] Field of Search ................ 355/53, 67, 71

[56] References Cited

U.S. PATENT DOCUMENTS

| | | | |
|---|---|---|---|
| 4,992,825 | 2/1991 | Fukuda et al. | 355/53 |
| 5,113,286 | 5/1992 | Morrison | 359/569 |
| 5,264,898 | 11/1993 | Kamon et al. | 355/67 |
| 5,291,012 | 3/1994 | Shimizu et al. | 250/216 |

OTHER PUBLICATIONS

"Phase-Shifting Mask and FLEX method for Advanced Photo-lithography"—H. Fukuda et al.—SPIE vol. 1264 Optical/Laser Microlithography III (1990)—pp. 14–25.

"A Novel Method for Improving the Defocus Tolerance in Step and Repeat Photolithography"—T. Hayashida et al.—SPIE vol. 772 Optical Microlithography VI (1987)—5 pages.

Primary Examiner—Michael L. Gellner
Assistant Examiner—Daniel P. Malley
Attorney, Agent, or Firm—Henry D. Pahl, Jr.

[57] ABSTRACT

In the microlithographic projection system disclosed herein, a reticle whose image is to be projected is illuminated with light having an essentially uniform intensity distribution over the reticle and angular distribution which is annularly concentrated. The annular concentration is produced by a phase grating interposed between the light source and a kaleidoscope which generates multiple overlapping images of this light source. The grating employs an array of elements of differing transmission phasings which suppresses zero order transmission and concentrates incident energy in an annularly diverging beam array.

9 Claims, 2 Drawing Sheets

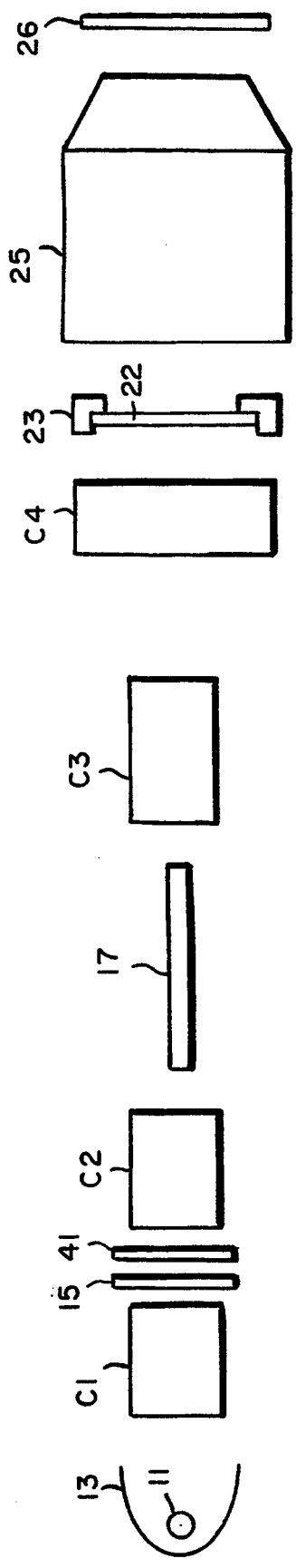
FIG.IA
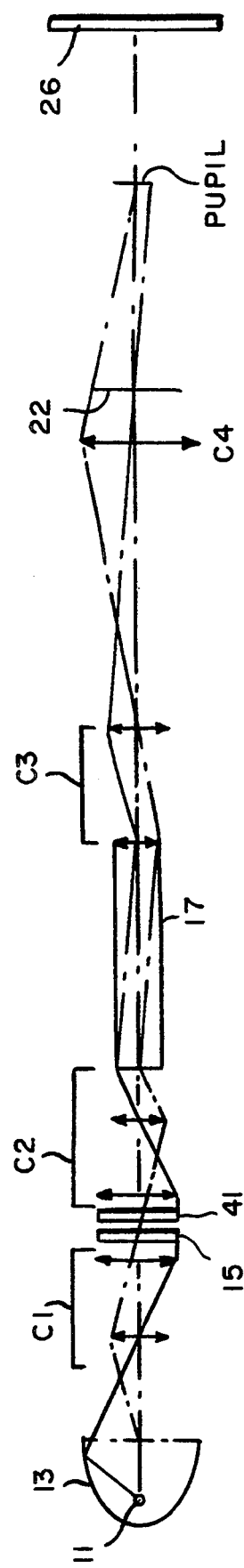
FIG.IB

MICROLITHOGRAPHIC PROJECTION SYSTEM

BACKGROUND OF THE INVENTION

The present invention relates to a microlithographic projection system and more particularly to such a system which provides improved working resolution and improved depth of focus.

Microlithography is widely employed in the manufacture of semiconductor integrated circuits. Typically, the image of a reticle is projected at reduced scale onto the surface of a semiconductor wafer which has been coated with a suitable photosensitive resist. Exposure and developing of the resist then allows features or regions of the wafer surface to be appropriately treated, e.g. by etching or the introduction of dopant elements.

Efforts have been ongoing to increase the complexity and sophistication of integrated circuits by reducing feature size. While the reduction of feature size has pushed the art of optical lithography towards its theoretical limits, there still exists a number of practical problems where improvement is possible. Among the practical problems which remain is the limited ability of presently available automatic focussing systems to precisely determine the height of the wafer with respect to the normally vertical axis of the projection lens. Similarly, at the very fine feature sizes being utilized, the thickness of the resist coating itself becomes appreciable. Accordingly, any advancement in the optical system which will improve depth of focus and effective working resolution is highly significant in the industry.

It is known that image contrast increases if the angular distribution of illumination is weighted towards the periphery of the illuminator numerical aperture. By this is meant that the light approaching each point on the reticle is angularly concentrated in an annular fashion. Such an angular concentration can be easily produced by introducing a stop which not only defines the diameter of the effective light source, but also includes an occluding central spot which blocks light which is proceeding on or close to the optical axis. Such an approach, however, is highly inefficient and adversely impacts system throughput, since it effectively throws away a major portion of the light available to expose the resist.

Among the several objects of the present invention are the provision of a microlithographic projection system which provides improved effective working resolution; the provision of such a system which provides improved depth of focus; the provision of such a system which effects an annular concentration of the angular distribution of the projected light; the provision of such a system which efficiently utilizes available light; the provision of such a system which is highly reliable and which is of relatively simple and inexpensive construction. Other objects and features will be in part apparent and in part pointed out hereinafter.

SUMMARY OF THE INVENTION

The microlithographic projection system of the present invention employs a light source and at least one lens, e.g. a condenser lens, for imaging the light source through a reticle and into a projection lens. Interposed between the light source and the condenser lens is a phase grating which suppresses zero order transmission and concentrates incident energy in an annular array. Preferably, a kaleidoscope generates an array of multiple overlapping images of the source from the light coupled through the condenser lens.

BRIEF DESCRIPTION OF THE DRAWINGS

FIGS. 1A and 1B are a block diagram and an image diagram, respectively, of an illuminator and microlithographic projection system providing annularly concentrated illumination of a reticle in accordance with the present invention;

Corresponding reference characters indicate corresponding parts throughout the several views of the drawings.

DESCRIPTION OF THE PREFERRED EMBODIMENT

Figure 2:
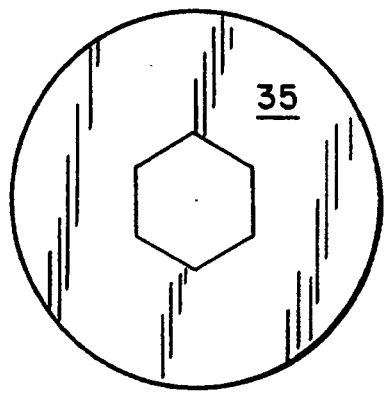
FIG. 2 is a diagram of an aperture stop employed in the apparatus of FIG. 1A.

The particular embodiment of the present invention described herein is implemented as an improvement in an illuminator which is manufactured and sold by the GCA Unit (Andover, Mass.) of General Signal Corporation under the trade designation MAXIMUS 2000. The illuminator is typically incorporated in a step and repeat projector as the light source which directs light through a reticle and into a projection lens. FIG. 1A is a diagram illustrating the main optical components of the illuminator and projection system shown laid out in straight line fashion. In actual manufacture, the optical path is typically folded at several points by mirrors, as is well understood in the art. FIG. 1B diagrammatically illustrates the imaging performed by the various lens in the FIG. 1A configuration and thus facilitates an understanding of its overall operation.

A high pressure mercury lamp 11 constitutes the initial light source for the projection system. Lamp 11 is mounted at one focus of an ellipsoidal mirror 13. Mirror 13 refocuses the collected light at the entrance of a first condenser lens conventionally designated C1. Condenser lens C1 effectively collimates the incident light and directs it through a spectral filter 15 which selects those component wavelengths which are appropriate for exposing the particular resist being used, e.g. I-line radiation at 365 nanometers.

A second condenser lens, conventionally designated C2, directs light from the spectral filter 15 into a hexagonal kaleidoscope rod 17. As is understood in the art, the kaleidoscope rod generates an array of multiple, overlapping images of the lamp and thereby produces, by averaging, an illumination intensity which is effectively uniform over the illuminator field. Light leaving the kaleidoscope rod is directed by third and fourth condenser lenses, C3 and C4 respectively, through a reticle 22 held in a suitable mount 23, and into a projection lens 25. The projection lens 25, in turn, forms an image of the reticle pattern on the surface of a semiconductor wafer 26 held on a suitable multi-axis stage (not shown).

The third condenser lens C3 typically incorporates an aperture or stop which defines the numerical aperture of the illuminator itself. In the MAXIMUS 2000 product, the stop is hexagonal corresponding to the cross-section of the kaleidoscope rod 17. Since the reticle 21 is typically square, some light which is unused for exposure is available for dose measurement and like needs. This conventional stop configuration is illustrated in FIG. 2 with the opaque periphery being designated by reference character 35.

Figure 3:
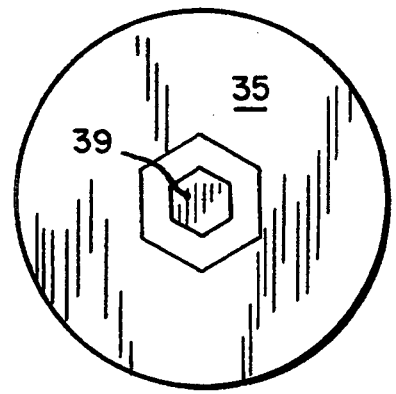
FIG. 3 illustrates a modified form of an aperture stop.

As indicated previously, a desirable angular concentration of light on the reticle could be obtained by employing a stop, such as that illustrated in FIG. 3 which includes not only an opaque periphery 35 defining the numerical aperture but also a central occluding spot as designated by reference character 39. Such a construction would, however, waste much of the light available from the illuminator.

In accordance with the practice of the present invention, an annular concentration of angular distribution is obtained, not by occluding part of the available light but, rather, by interposing a phase grating which suppresses zero order transmission and concentrates incident energy in an annularly diverging array of diffracted beams. In the embodiment illustrated in FIG. 1, the phase grating, designated by reference character 41, is placed in the light path between the first and second condenser lenses C1 and C2, i.e. adjacent the spectral filter 15. The phase grating is then effectively imaged by the second condenser lens C2 into the entrance of the kaleidoscope rod 17. As an alternative, the phase grating itself could be placed at the entrance of the kaleidoscope rod but such an arrangement is mechanically less easily implemented in the MAXIMUS 2000 environment.

While it would be possible to utilize a phase grating which would produce a uniform annular distribution around the projection system's axis, e.g. using a circular Bessel function phase zone plate, it is presently preferred to utilize a phase grating which concentrates incident energy in a diverging array of four diffracted beams produced by the diffraction of the positive and negative first orders along two orthogonal axes with zero order transmission being suppressed. The multiple reflections within the kaleidoscope rod 17 change the diverging four beam array into an effectively uniform annular angular distribution. It is believed, however, that the four beam pattern could be used without the kaleidoscope if some other mechanism were utilized for providing a uniform intensity for distribution over the reticle. The diverging four beam pattern by itself would be expected to produce the greatest improvement in image contrast and depth of focus to occur for features which are horizontally or vertically aligned and this corresponds well with the regular features typically found in dense integrated circuits, e.g. memory chips. Accordingly, the four beam diverging pattern itself should be considered to be an annularly diverging pattern or array in the context of the present invention.

Figure 4:
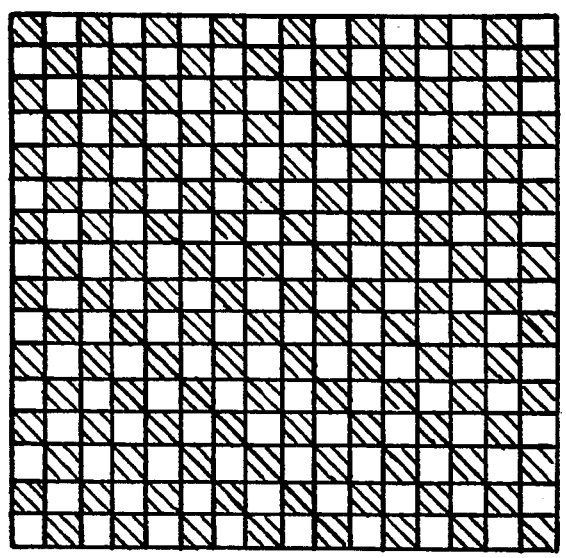
FIG. 4 illustrates a phase grating employed in the system of FIG. 1A in the practice of the present invention.

A diverging four beam array of diffracted beams can be produced by a phase grating formed in a checkerboard pattern as illustrated in FIG. 4. A suitable material is fused silica. In this checker board pattern, alternating squares in each row are etched to provide a phasing different than that of the unetched neighboring squares and the patterns are staggered on alternate rows so that a similar periodicity exists on each orthogonal axis. Depending on the wavelength involved and the amount of divergence desired, the appropriate grating period is in the order of two to ten microns and the etch depth is in the order of 0.2 to 0.5 microns. It should be understood that the "beams" referred to are relatively wide in relation to the offset between them.

In generating the array of multiple overlapping images of the source, the kaleidoscope rod 17 will likewise repeatedly replicate the annular diverging array of beams with each image. Thus, although the intensity of illumination will be essentially uniform over the reticle, the light approaching each point on the reticle will have an annular angular concentration.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A microlithographic projection system comprising:
   mount means for holding a reticle whose image is to be projected;
   a projection lens;
   a light source;
   at least one lens for imaging said light source through a reticle into said projection lens;
   interposed between said one lens and said projection lens, a phase grating means for suppressing zero order transmission and for concentrating incident energy in an annularly diverging array.

2. A system as set forth in claim 1 wherein said phase grating comprises a two-dimensional array of elements having differing transmission phasings.

3. A system as set forth in claim 1 wherein said phase grating comprises a checkerboard type array of elements which are of alternating transmission phasing.

4. A microlithographic projection system comprising:
   a light source;
   means for imaging said light source;
   a kaleidoscope optically coupled to said imaging means for generating an array of images of said source;
   interposed between said source and said kaleidoscope, a phase grating means for suppressing zero order transmission and for concentrating incident energy at said wavelength in an annularly diverging array;
   mount means for holding a reticle whose image is to be projected;
   a projection lens for receiving light from said kaleidoscope through a reticle held in said mount means and for forming an image of such reticle.

5. A system as set forth in claim 4 wherein said phase grating comprises a checkerboard type array of elements which are of alternating transmission phasing.

6. A projection system as set forth in claim 4 further comprising intermediate lens means for directing light from said kaleidoscope, through a reticle held in said mount means, into said projection lens, said light having an essentially uniform intensity distribution and an annular angular concentration at said reticle.

7. A projection system as set forth in claim 4 wherein said kaleidoscope has a hexagonal cross section.

8. A microlithographic projection system comprising:
   a light source;
   kaleidoscope means for generating an array of multiple overlapping images of said source;

interposed between said source and said kaleidoscope, a phase grating means for providing an array of elements of differing transmission phasings means for suppressing zero order transmission and for concentrating incident energy at said wavelength in an annularly diverging array of diffracted beams;

mount means for holding a reticle whose image is to be projected;

a projection lens;

intermediate lens means for directing light from said kaleidoscope, through a reticle held in said mount means, into said projection lens.

9. A microlithographic projection system comprising:

a light source providing light at a preselected wavelength;

at least one lens for imaging said light source;

a kaleidoscope for generating an array of multiple overlapping images of said source from light coupled through said lens;

interposed between said source and said kaleidoscope, a phase grating means for providing a two-dimensional checkerboard type of array of elements of alternating transmission phasings for suppressing zero order transmission and for concentrating incident energy at said wavelength in an annularly diverging array of diffracted beams;

mount means for holding a reticle whose image is to be projected;

a projection lens;

intermediate lens means for directing light from said kaleidoscope, through a reticle held in said mount means, into said projection lens, said light having an essentially uniform intensity distribution and an annular angular concentration at said reticle.

* * * * *